(12) United States Patent
Kimling et al.

(10) Patent No.: US 12,436,473 B2
(45) Date of Patent: Oct. 7, 2025

(54) OPTICAL ELEMENT, OPTICAL SYSTEM, LITHOGRAPHY SYSTEM, AND METHOD FOR OPERATING AN OPTICAL ELEMENT

(71) Applicant: Carl Zeiss SMT GmbH, Oberkochen (DE)

(72) Inventors: Johannes Kimling, Aalen (DE); Peter Graf, Königsbronn (DE); Norbert Wabra, Werneck (DE); Sonja Schneider, Oberkochen (DE); Reimar Finken, Westhausen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 425 days.

(21) Appl. No.: 18/148,612

(22) Filed: Dec. 30, 2022

(65) Prior Publication Data

US 2023/0138850 A1  May 4, 2023

Related U.S. Application Data

(63) Continuation of application No. PCT/EP2021/068161, filed on Jul. 1, 2021.

(30) Foreign Application Priority Data

Jul. 6, 2020 (DE) .......................... 102020208415.7

(51) Int. Cl.
*G03F 7/00* (2006.01)
(52) U.S. Cl.
CPC ...... *G03F 7/70891* (2013.01); *G03F 7/70316* (2013.01); *G03F 7/70958* (2013.01)
(58) Field of Classification Search
CPC ............. G03F 7/70891; G03F 7/70316; G03F 7/70958; G02B 7/008
See application file for complete search history.

(56) References Cited

U.S. PATENT DOCUMENTS

| | | | |
|---|---|---|---|
| 4,730,900 A * | 3/1988 | Uehara | G03F 7/70241 |
| | | | 374/132 |
| 5,679,946 A | 10/1997 | Mukai et al. | |
| 5,883,704 A | 3/1999 | Nishi et al. | |
| 6,521,877 B1 | 2/2003 | Muller-Rissmann | |
| 2003/0169520 A1 | 9/2003 | Goldstein | |
| 2009/0257032 A1 | 10/2009 | Eva | |
| 2009/0279068 A1 | 11/2009 | Letz | |

FOREIGN PATENT DOCUMENTS

| | | |
|---|---|---|
| DE | 199 56 353 C1 | 8/2001 |
| DE | 10 2008 023 238 A1 | 12/2009 |
| DE | 10 2010 047 839 A1 | 11/2011 |
| DE | 10 2020 204 722 A1 | 11/2020 |
| EP | 2 650 730 A2 | 10/2013 |

OTHER PUBLICATIONS

CN 209485538 U (Gan, Yao-huan) machine translation (Year: 2019).*
Translation of International Search Report for corresponding PCT Appl No. PCT/EP2021/068161, dated Nov. 15, 2021.
International Search Report and Written Opinion in International Appln. No. PCT/EP2021/068161, Nov. 15, 2021, 17 pages (with English translation).

* cited by examiner

*Primary Examiner* — James A Dudek (74) *Attorney, Agent, or Firm* — Fish & Richardson P.C.

(57) ABSTRACT

An optical element for a lithography system comprises an optical surface and a photoresistor having an electric photoresistor value that varies according to an amount of light incident on a region of the optical surface.

20 Claims, 9 Drawing Sheets

OPTICAL ELEMENT, OPTICAL SYSTEM, LITHOGRAPHY SYSTEM, AND METHOD FOR OPERATING AN OPTICAL ELEMENT

CROSS-REFERENCE TO RELATED APPLICATIONS

The present application is a continuation of, and claims benefit under 35 USC 120 to, international application PCT/EP2021/068161, filed Jul. 1, 2021, which claims benefit under 35 USC 119 of German Application No. 10 2020 208 415.7, filed Jul. 6, 2020. The entire disclosure of each of these applications is incorporated by reference herein.

FIELD

The present disclosure relates to an optical element for a lithography apparatus, an optical system, a lithography apparatus, and a method for operating such an optical element.

BACKGROUND

Microlithography is used for producing microstructured component parts, such as for example integrated circuits. The microlithography process is performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate.

During the exposure of the wafer for example, non-rotationally symmetrical, light-induced heating of an optical element (mirror or lens element) of the projection exposure apparatus (also called "projection system") may arise. This local heating can result in a corresponding non-rotationally symmetrical expansion of the optical element and a non-rotationally symmetrical refractive index distribution of the optical element, as a result of which the imaging quality of the optical element is reduced.

In the case of high demands on the imaging quality, such as are desired in projection exposure methods in microlithography for example, the described light-induced imaging aberrations generally is not desirable.

One option for reducing the described aberrations lies in heating, such as counter-heating, specific points on the optical element.

The documents U.S. Pat. No. 5,679,946 A, US 2003/0169520 A1, and U.S. Pat. No. 4,730,900 A describe such heating. These documents each disclose an optical arrangement comprising temperature sensors, which measure a temperature of an optical element, and heating elements, which heat the optical element dependent on the temperature measured by the sensors.

In the described approaches, the amount of counter-heating is calculated on an individual basis dependent on the sensed temperature, and this involves computing power. Furthermore, a change in the illumination settings can involve a time delay of the order of minutes by using a measured temperature profile. In individual cases, this might not fast enough and, for example, might not allow the temperature to be corrected within the illumination time of a wafer.

An alternative approach, with which deformations of the optical element are compensated without relying on information about the light exposure of the optical element, is described in document U.S. Pat. No. 5,883,704 A, for example. Therein, a temperature of an optical element of a projection exposure apparatus is changed by a temperature controller in such a way that a better image quality is detected using a sensor that measures image distortion. However, detecting the image quality can be laborious. Further, it is possible that the exposure can only be implemented after the temperature adjustment.

SUMMARY

The present disclosure seeks to provide an improved optical element for a lithography apparatus.

According to a first aspect, an optical element for a lithography apparatus is proposed. The optical element comprises:

an optical surface and
a photoresistor having an electrical photoresistance value which varies dependent on an amount of luminous energy incident on a region of the optical surface.

The photoresistor can be used to measure light incident on the region of the optical surface. The measurement of the incident light can be desirable for counter-heating the points where no light is incident. The amount of incident luminous energy is specified directly by the photoresistance value. A separate temperature sensor for measuring the temperature in order to derive the amount of incident luminous energy therefrom can be dispensed with.

When the projection exposure apparatus is switched on and/or when the exposure settings are changed, the light absorption by the optical surface can be sensed very quickly, such as in the millisecond range, using the photoresistor. A complete and reliable absorption image of the region of the optical surface can be obtained with small time delays and without having to resort to a temperature measurement.

The optical element can be a mirror or a lens element. For example, the optical element can be an optical element of the projection exposure apparatus of a lithography apparatus, for example an EUV ("extreme ultraviolet") or a DUV ("deep ultraviolet") lithography apparatus. During the operation of the lithography apparatus, for example during the exposure of the wafer, different amounts of luminous energy can be incident on different regions of the optical surface of the optical element and can lead to the deformations and undesirable optical aberrations already described above.

The optical surface is for example a surface of the optical element on which working light is incident during operation in the lithography apparatus (for example during exposure within the scope of chip production). The optical surface can consequently be the surface of the optical element that is optically exposed. The optical surface is, for example, a mirror surface or a lens element surface. For example, the optical surface can be divided into a plurality of regions. Each region of the optical surface comprises at least a part of the optical surface. By way of example, the regions can have a rectangular or a circular shape.

The photoresistor is a light-sensitive electrical component part. The electrical photoresistance value (also "photoresistance value" or "resistance value") is a parameter of the photoresistor that depends on the luminous power absorbed. A photoresistor may be assigned to at least a region of the optical surface such that the amount of luminous energy incident on the region of the optical surface is proportional to the amount of luminous energy incident on the photoresistor. In this case, the photoresistor is arranged, for example, below the assigned region. The more light is incident on the photoresistor, the lower its electrical resistance value. The cause of this function lies in the internal photoelectric effect in a layer of the photoresistor, which includes a semiconductor (e.g., an amorphous or crystalline semiconductor).

For example, the photoresistor is nanostructured. Conceivable dimensions of the photoresistor are, for example, 160×200×20 nm, with metal contacts possibly being additionally added thereto. For example, the photoresistor should be arranged close to the optical surface so that it can sense the incident light. The resistance value varies, for example, in the megaohm range.

The photoresistor, for example including contacts and conductor tracks, is applied to the surface of an optical element. A layer of quartz is then applied and the latter is smoothed as part of the surface treatment. In the case of lens elements, it can be desirable that the area of the resistor is small enough so as not to absorb or scatter too much incident light.

The photoresistor is assigned for example to the region of the optical surface. This means, for example, that the photoresistor senses the amount of luminous energy incident on the region and/or is arranged under the corresponding region.

According to an embodiment, the photoresistor is suitable for heating the optical element (especially the region) dependent on the electrical photoresistance value, in such a way that the heating compensates a deformation of the optical element (especially the region) that occurs due to the incident light and/or a refractive index change that occurs due to the incident light.

Compensation means for example that the optical effect of the deformation and/or the refractive index change is reduced and/or symmetrized. As a result, the optical effect of the deformation and/or the refractive index change can be better corrected.

The photoresistor can be suitable for heating the region dependent on the electrical photoresistance value, in such a way that a heat input into this region due to the incident light is compensated by a reduced electrical heating power.

The heating by the photoresistor serves for example to counter-heat the region of the optical surface on which little or no light is incident. The heating of the optical element by light absorption can be compensated by heating the region, as a result of which the optical element is deformed for example uniformly and/or rotationally symmetrically. This can prevent unwanted optical aberrations.

Especially in addition to sensing the amount of luminous energy, the photoresistor can operate as a heating resistor which converts electrical energy into thermal energy (heat). For example, the heating power of the photoresistor is higher, the less light there is (large resistance). In this case, the photoresistor can be energized by a current of a few milliamperes (mA). Providing heating by the photoresistor can be desirable because, for example, a change in the photoresistance value has a direct effect on the heat generated. Counter-heating can therefore be implemented with little effort.

According to a further embodiment, the optical element further comprises a heating element suitable for heating the region dependent on the electrical photoresistance value.

The heating element serves for example to counter-heat a region of the optical surface on which little or no light is incident. The heating of the region can compensate for the heating of the optical element due to light absorption.

The heating power of the heating element can be proportional to the resistance value. In order to heat the region dependent on the photoresistance value, the heating element can be coupled directly in an electrical circuit with the photoresistor or can alternatively receive a control signal generated by a control unit dependent on the resistance value.

For example, the heating element is not a photoresistor. Rather, it can be provided in addition to the photoresistor. The heating element comprises, for example, a resistance heater, for example a heating wire, or an infrared heating element (IR heating element). In the resistance heater, current flows through a conductive material of the heating element, for example, as a result of which Joule heat is generated. By way of example, providing a resistance heater as the heating element is desirable because a change in the photoresistance value has a direct effect on the amount of current flowing through the heating element and thus directly controls the heat generated.

The IR heating element can be, for example, an infrared laser or a broadband IR radiation source, for example an infrared lamp, which generates heating radiation with a suitable heating power. It goes without saying that radiation at wavelengths other than in the IR wavelength range can optionally also be used as heating radiation.

Providing a heating element in addition to heating with the photoresistor can be desirable because the heating capacity can thereby be increased. For example, the photoresistance value and a resistance value of the heating element can be approximately the same. In this case, the total heating power from the photoresistor and the heating element can be controlled by the photoresistance value.

When heating the optical element, the photoresistor, the heating element or a combination of photoresistor and heating element generates for example a surface heating power density of at least 100 $W/m^2$, such as at least 200 $W/m^2$, for example at least 500 $W/m^2$. This surface heating power density can also be provided jointly by a plurality of photoresistors and/or heating elements that are arranged distributed over the optical element.

According to a further embodiment, the heating element is connected in parallel with the photoresistor. For example, the heating element is electrically connected in parallel with the photoresistor in an electrical circuit. The heating element and the photoresistor can be directly coupled to one another so that the total heating power is controlled by the photoresistance value.

According to a further embodiment, the heating element is electrically connected to the photoresistor in an electrical circuit and a change in the electrical photoresistance value changes a total resistance of the electrical circuit in such a way that there is a change in heating of the region by the heating element.

The heat generated by the heating element is generally dependent on the amount of current that flows through the heating element for example. A change in the photoresistor can induce a change in the total resistance of the electrical circuit, thereby varying the heating of the region. Consequently, the photoresistor can be used as a control element for the total heating power of the electrical circuit.

For example, the electrical circuit comprises the heating element, the photoresistor, and a current source (such as a direct current source). The electrical circuit may comprise additional electrical components, for example another resistor or a voltmeter. The individual components of the electrical circuit can be connected in series and/or in parallel.

According to a further embodiment, the heating element is configured to heat the region more, the greater the electrical photoresistance value.

The less light is incident on the photoresistor, the higher its electrical resistance value. Due to the photoresistance value increasing when there is little light, a total resistance of the electrical circuit is increased and the heating power of the heating element increases. For example, a region where little light is incident is heated more than a region where more light is incident. The more light is incident on the region, the less it is heated by the heating element. For example, a very strongly absorbing region is not heated at all. As a result, optical aberrations can be prevented relatively efficiently.

According to a further embodiment, the photoresistor and/or the heating element is arranged in a substrate of the optical element, the substrate being arranged below the region of the optical surface. For example, the photoresistor is arranged directly below the layer that forms the optical surface. The photoresistor is in the form of a film for example.

According to a further embodiment, the optical element comprises a plurality of photoresistors and/or a plurality of heating elements, one photoresistor and one heating element together forming a heating module in each case and each heating module being suitable for heating a different region of the optical surface.

For example, the optical surface is divided into a plurality of regions, with each region being assigned a heating module, the photoresistor of which senses the photoresistance value of the region and which heats the region accordingly. As a result, the entire optical surface can be heated dependent on the absorbed light and optical aberrations are prevented.

According to a further embodiment, each heating module is suitable for being supplied with current by a dedicated power supply line, the power supply lines being arranged within the substrate of the optical element and for example running parallel to one another.

The power supply lines are, for example, individually controllable lines that run in the substrate and each supply a heating module with current (direct current). The power supply lines connect the heating modules to a common direct current source, for example, or to separate direct current sources. The photoresistors and/or the heating modules can be arranged next to one another in parallel with one another or slightly offset from one another.

According to a further embodiment, the optical element comprises at least one power supply line which is connected to a plurality of heating modules and suitable for supplying the latter with power, for example according to a multiplex method.

This embodiment can be desirable in that fewer power supply lines are used overall for supplying the heating modules with current. To this end, the heating modules can be arranged in a matrix arrangement. For example, each column and each row of the heating module matrix arrangement is supplied with current using exactly one power supply line. A matrix arrangement with N×N photoresistors and/or heating modules (i.e., with N columns and N rows of photoresistors and/or heating modules) involves for example 2N power supply lines, while individual control with separate power supply lines involves for example $N^2$ power supply lines.

The multiplex method for power supply is distinguished for example by the fact that columns and/or rows of the matrix are successively supplied with current, with this power supply being repeated cyclically.

According to a further embodiment, the photoresistor comprises at least one semiconductor material, the semiconductor material comprising amorphous silicon carbon nitride (SiCN) or a silicon carbon alloy (SiC:H) for example.

SiCN is an example of a semiconductor material with a high sensitivity in the UV range and can therefore be suitable for applications in an EUV or DUV lithography apparatus. Another suitable material with relatively high electrical conductivity is, for example, p-doped nanocrystalline SiC:H (silicon carbide admixed with hydrogen). The colon indicates that there is a bond between the chemicals SiC and H.

The dark conductivity (conductivity of the photoresistor after several seconds of darkness) and the photoconductivity (also "light conductivity", conductivity of the photoresistor at 1000 lx) of the photoresistor can be set via doping and layer thickness. At 60 nm thickness, dark conductivity and photoconductivity for SiC:H are approximately 10 and 15 $\Omega^{-1}$, respectively.

In general, however, other semiconductors are also suitable as material for the photoresistor. The semiconductor should have band gaps below the photon energy of the light used. On account of the wavelength spectrum of the illumination present in lithography apparatuses, selectivity (for example high sensitivity) in the UV range is not mandatory, because light of other undesired wavelengths is not incident on the photoresistor in any case.

According to a second aspect, an optical system for a lithography apparatus is proposed.

It comprises:
an optical element according to the first aspect or according to an embodiment of the first aspect, and
at least one direct current source suitable for supplying current to the photoresistor and/or the heating element, and/or
a control unit suitable for controlling, dependent on the electrical photoresistance value, the heating of the region of the optical surface by the photoresistor and/or by the heating element, and/or
an external heating element, for example an IR heating element, suitable for heating a region dependent on the electrical photoresistance value.

In order to control the heating, the control unit can for example vary a power supply of the photoresistor and/or the heating element. To this end, the control unit can be connected to the direct current source and can control the latter in order to supply the photoresistor and/or the heating element with a suitable current. The control unit controls the direct current source for example in such a way that photoresistors and heating element are supplied with current using a multiplex method.

Alternatively, the control unit can also control the heating element by transmitting a control signal, which is dependent on the photoresistance value, to the heating element. This variant can be used for example in the case of external heating elements which are in the form of IR heating elements, for example. In this context, external means that the heating element is arranged neither in the optical element nor in contact with the optical element.

According to a third aspect, a lithography apparatus, for example EUV or DUV lithography apparatus, is proposed, comprising an optical element according to the first aspect or according to an embodiment of the first aspect or comprising an optical system according to the second aspect or according to an embodiment of the second aspect.

The EUV lithography apparatus for example uses light having a wavelength in the range of 0.1 nm to 30 nm, for example 13.5 nm. The DUV lithography apparatus for example uses light having wavelengths of 248 nm or 193 nm.

According to a fourth aspect, a method is proposed for operating an optical element of a lithography apparatus, for example for operating the optical element according to the first aspect or according to an embodiment of the first aspect. The method comprises:

sensing an electrical photoresistance value of a photoresistor, the electrical photoresistance value varying dependent on an amount of luminous energy incident on a region of the optical surface; and heating the optical surface, for example the region, dependent on the electrical photoresistance value.

By sensing the electrical photoresistance value, a measurement sensor is formed, for example, by which light absorbed by the region is sensed. Such a measurement sensor can be used in both DUV and EUV lithography apparatuses. It is also possible to store the photoresistance value in a standard memory unit (e.g., in a RAM).

The embodiments and features described for the optical element are correspondingly applicable to the proposed optical system, to the proposed lithography apparatus, and to the proposed method, and vice versa.

According to an embodiment, the optical surface is heated using the photoresistor and/or a heating element.

According to a further embodiment, the method further comprises:

heating the region dependent on the electrical photoresistance value via a heating element electrically connected to the photoresistor, a change in the electrical photoresistance value changing a total resistance of the electrical circuit such that there is a change in heating of the region by the heating element; and/or controlling the heating element via the control unit dependent on the sensed electrical photoresistance value; and/or heating a region containing an adhesive protector dependent on the electrical photoresistance value using the heating element, the adhesive protector covering an adhesive used to connect the optical element to a mount.

The above-described optical element and/or optical system can be used in different ways in the lithography apparatus. Firstly, direct heating of the region using the photoresistor and/or the heating element is possible dependent on the photoresistor.

Further, the control unit can additionally supply control signals to the heating element dependent on the resistance value. This embodiment is used for example in EUV lithography apparatuses in which external IR heating elements heat mirrors and can thus be controlled dependent on an amount of incident luminous energy.

In a further application, the optical element or the optical system is found in the adhesive region of a DUV lithography apparatus. This is because the optical element may be fastened to a mount (frame) using an adhesive. Since the adhesive may be damaged by irradiation, it can be protected by an adhesive protector from the incoming radiation. However, the adhesive protector can absorb a significant amount of light as a result of which the optical element can be severely deformed in the region of the adhesive protector. This can be compensated for example by the fact that the photoresistor and/or the heating element heat the region dependent on the photoresistance value. For example, the photoresistor and/or the heating element heats the region of the adhesive protector exposed to light less than the region of the adhesive protector not exposed to light, dependent on the photoresistor.

"A" or "an" in the present case should not necessarily be understood to be restrictive to exactly one element. Rather, a plurality of elements, such as for example two, three or more, may also be provided. Any other numeral used here should also not be understood to the effect that there is a restriction to exactly the stated number of elements. Rather, unless indicated otherwise, numerical deviations upwards and downwards are possible.

Further possible implementations of the disclosure also comprise not explicitly mentioned combinations of features or embodiments that are described above or below with respect to the exemplary embodiments. In this case, a person skilled in the art will also add individual aspects as improvements or supplementations to the respective basic form of the disclosure.

Further refinements and aspects of the disclosure are the subject of the dependent claims and also of the exemplary embodiments of the disclosure that are described below.

BRIEF DESCRIPTION OF THE DRAWINGS

The disclosure is explained in greater detail below on the basis of embodiments with reference to the appended figures.

DETAILED DESCRIPTION

Unless indicated otherwise, elements that are identical or functionally identical have been given the same reference signs in the figures. It should also be noted that the illustrations in the figures are not necessarily true to scale.

Figure 1A:
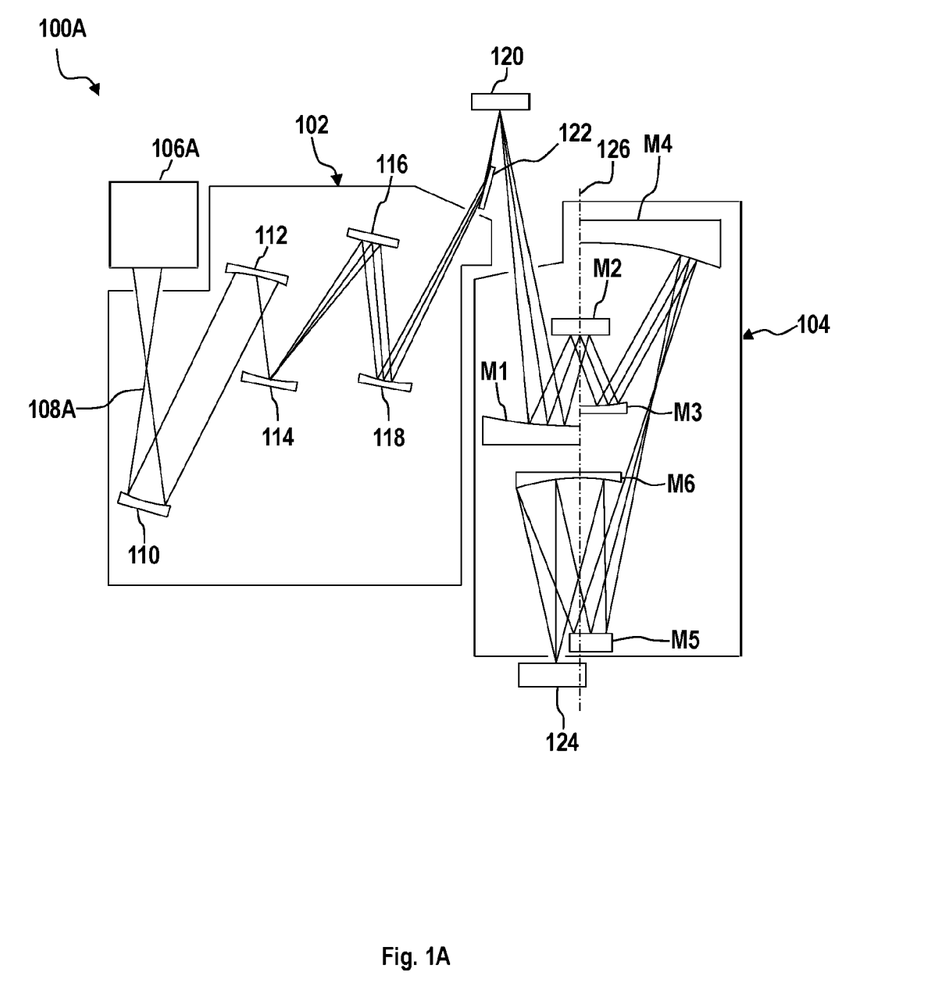
FIG. 1A shows a schematic view of an embodiment of an EUV lithography apparatus.

FIG. 1A shows a schematic view of an EUV lithography apparatus 100A comprising a beam shaping and illumination system 102 and a projection system 104. In this case, EUV stands for "extreme ultraviolet" and denotes a wavelength of the working light of between 0.1 nm and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which driving apparatuses for mechanically moving or setting optical elements are provided. Furthermore, electrical controllers and the like may also be provided in the machine room.

The EUV lithography apparatus 100A has an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is guided onto a photomask (reticle) 120. The photomask 120 is likewise embodied as a reflective optical element and can be arranged outside the systems 102, 104. Furthermore, the EUV radiation 108A may be directed onto the photomask 120 via a mirror 122. The photomask 120 has a structure which is imaged onto a wafer 124 or the like in a reduced fashion via the projection system 104.

The projection system 104 (also referred to as a projection lens) has six mirrors M1 to M6 for imaging the photomask 120 onto the wafer 124. In this case, individual mirrors M1 to M6 of the projection system 104 may be arranged symmetrically in relation to an optical axis 126 of the projection system 104. It should be noted that the number of mirrors M1 to M6 of the EUV lithography apparatus 100A is not restricted to the number shown. A greater or lesser number of mirrors M1 to M6 may also be provided. Furthermore, the mirrors M1 to M6 are generally curved on their front sides for beam shaping.

Figure 1B:
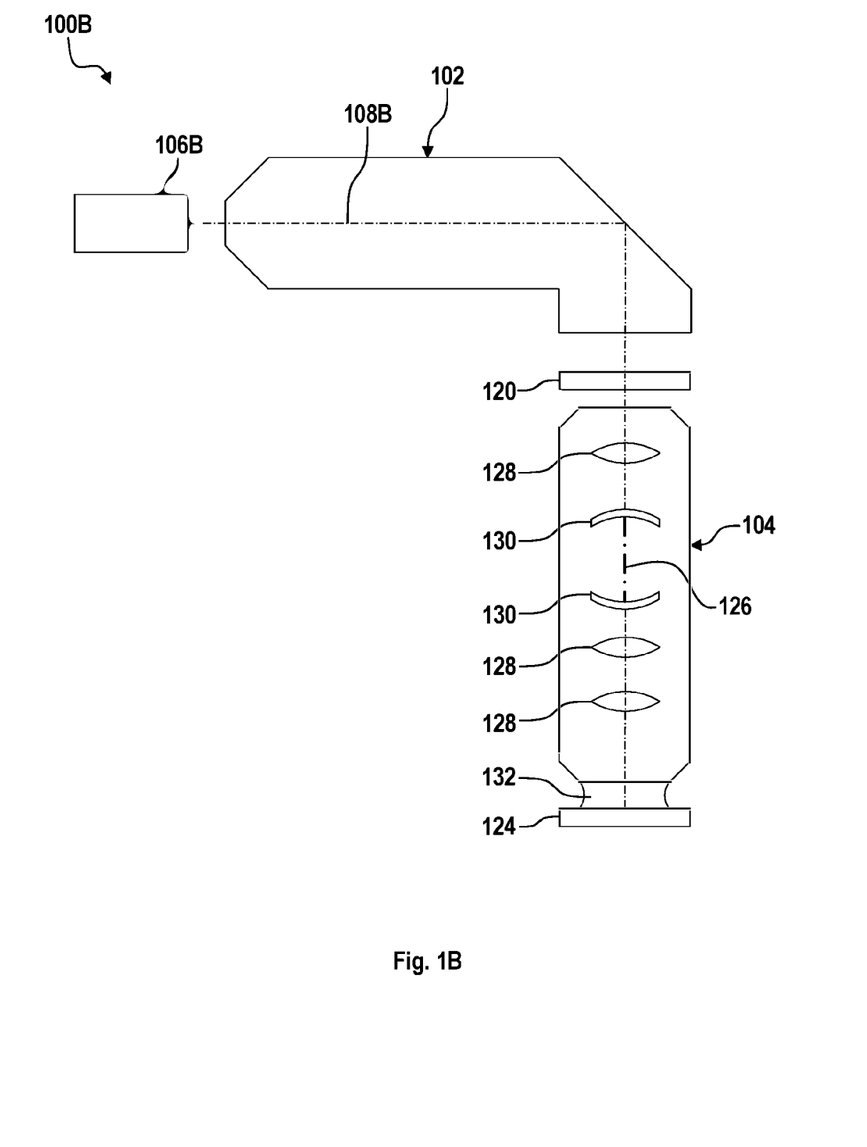
FIG. 1B shows a schematic view of an embodiment of a DUV lithography apparatus.

FIG. 1B shows a schematic view of a DUV lithography apparatus 100B, which comprises a beam shaping and illumination system 102 and a projection system 104. In this case, DUV stands for "deep ultraviolet" and denotes a wavelength of the working light of between 30 nm and 250 nm. As has already been described with reference to FIG. 1A, the beam shaping and illumination system 102 and the projection system 104 can be arranged in a vacuum housing and/or be surrounded by a machine room with corresponding driving apparatuses.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 is formed as a transmissive optical element and may be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 may be arranged symmetrically in relation to an optical axis 126 of the projection system 104. It should be noted that the number of lens elements 128 and mirrors 130 of the DUV lithography apparatus 100B is not restricted to the number shown. A greater or lesser number of lens elements 128 and/or mirrors 130 can also be provided. Furthermore, the mirrors 130 are generally curved on their front sides for beam shaping.

An air gap between the last lens element 128 and the wafer 124 can be replaced by a liquid medium 132 having a refractive index >1. The liquid medium 132 may be high-purity water, for example. Such a construction is also referred to as immersion lithography and has an increased photolithographic resolution. The medium 132 can also be referred to as an immersion liquid.

Figure 2:
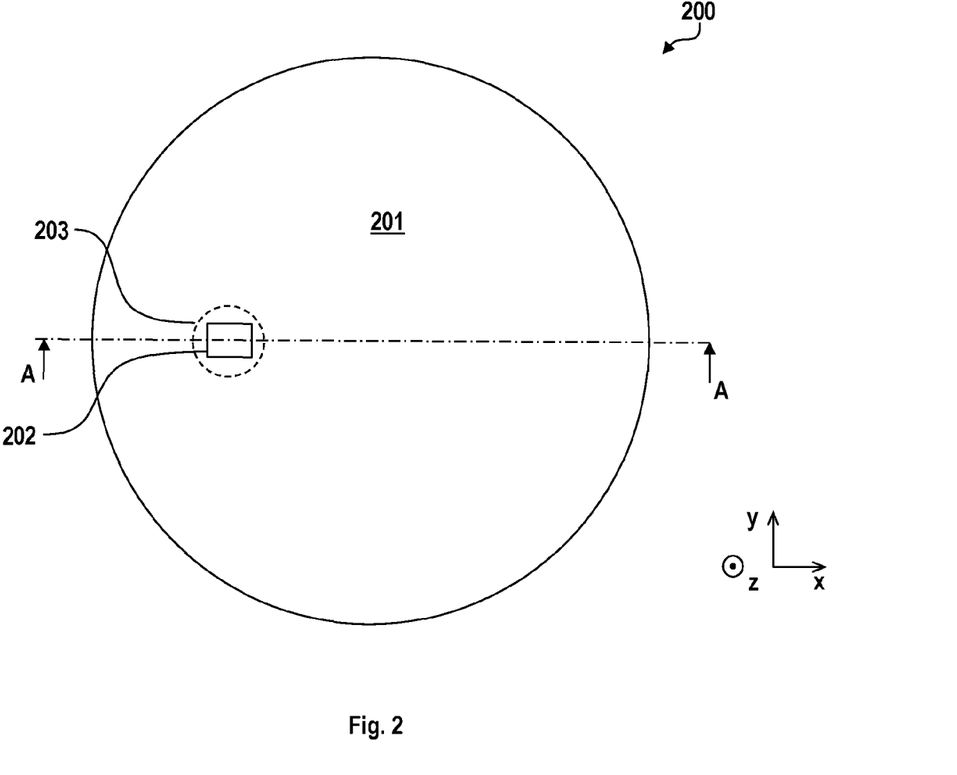
FIG. 2 shows a plan view of an optical element according to a first embodiment.
Figure 3:
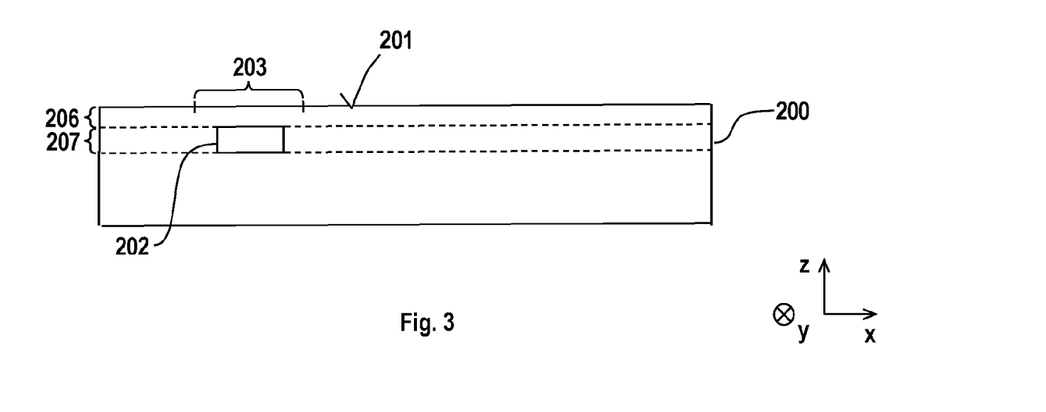
FIG. 3 shows a sectional view of the optical element in FIG. 2.

FIG. 2 shows a plan view of an optical element 200 according to a first embodiment. FIG. 3 moreover shows a sectional view of the optical element 200 in FIG. 2 along section line A-A. The optical element 200 is, for example, one of the lens elements 128 of the projection system 104 of the DUV lithography apparatus 100B. Alternatively, the optical element 200 may also be a mirror 130, for example, or the optical element 200 may be part of the projection system 104 of the EUV lithography apparatus 100A.

The lens element 200 is substantially round in a plan view and has a diameter of approximately 10 to 15 cm. In general, however, diameters of up to 35 cm are conceivable in other embodiments. The representation of FIG. 2 shows a view of an optical surface 201 of the lens element 200. The optical surface 201 is the surface on which the DUV radiation 108B is incident during operation of the lithography apparatus 100B. The optical surface 201 has a circular region 203 which corresponds to a region of the optical surface 201 under which a photoresistor 202 is provided in the lens element 200.

As is evident from FIG. 2, the photoresistor 202 is provided in a substrate 207 which forms a layer of the lens element 200 that is arranged directly below a surface layer 206 containing the optical surface 201. The photoresistor 202 can sense the light that is incident on a region 203 of the optical surface 201. The region 203 is formed at least immediately above the photoresistor 202. The region 203 may further extend somewhat around the section extending immediately above the photoresistor 202, as is evident from FIG. 2, for example, because light incident there is also sensed by the photoresistor 202. In this case, the region 203 is a circular region of the optical surface 201.

The photoresistor 202 has a photoresistance value $R_{photo}$, which varies dependent on how much light 108A is incident on region 203 and hence on photoresistor 202.

Figure 4:
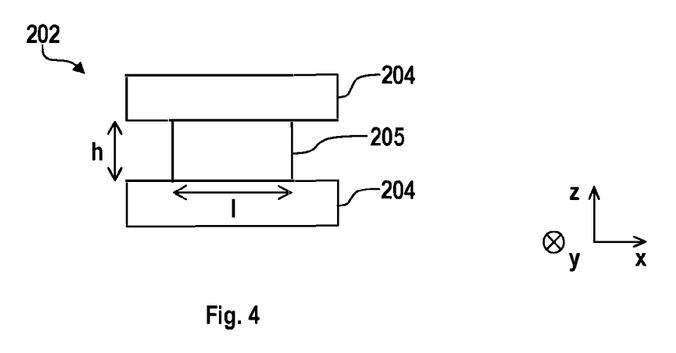
FIG. 4 shows a side view of a photoresistor.

FIG. 4 shows a side view of the photoresistor 202. The photoresistor 202 comprises a semiconductor 205 arranged between two metal contacts 204. The semiconductor 205 has a height h of 60 nm, a width (not visible in FIG. 4 as it extends along the Y-direction) of 200 nm and a length 1 of 150 nm.

The semiconductor 205 is made of p-doped nanocrystalline SiC:H. This material has band gaps below the photon energy of the DUV light 108B used.

Figure 5:
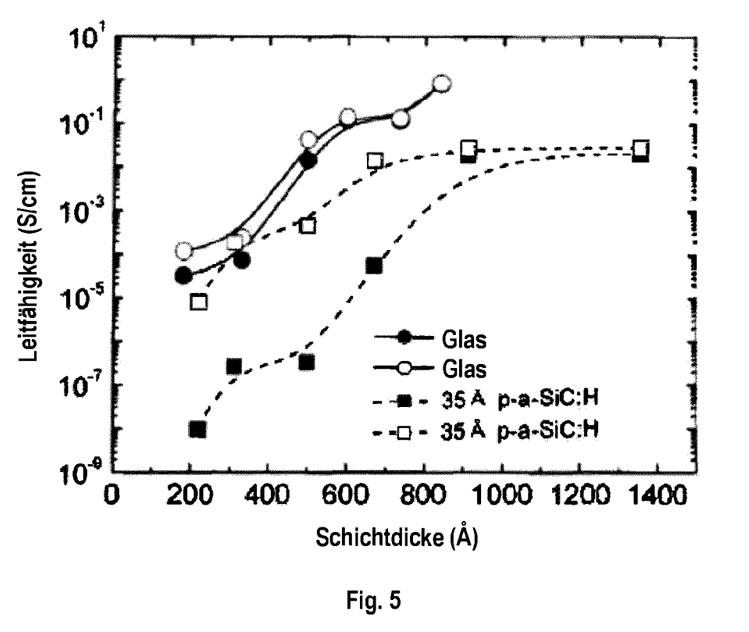
FIG. 5 shows a relationship between a conductivity of various materials and the layer thickness.

FIG. 5 shows a relationship between a conductivity of various materials and the layer thickness, with the circles corresponding to glass and the squares corresponding to p-type amorphous SiC:H (p-a SiC:H). The black-filled shapes indicate the conductivity without irradiation (dark conductivity), the white-filled shapes indicate the conductivity under irradiation (photoconductivity). FIG. 5 originates from the article "Ultrathin boron-doped microcrystalline silicon as a novel constant band gap buffer inserted at the p-a-SiC:H/i-a-Si:H interface of amorphous silicon solar cells", Journal of Applied Physics 87, 8778 (2000).

FIG. 5 shows that the conductivity of glass is hardly dependent on the light irradiation. However, the conductivity of SiC:H depends strongly on the light irradiation, especially at thin layer thicknesses (less than 800 Å). Therefore, SiC:H is suitable as a semiconductor material for the semiconductor 205 of the photoresistor 202.

The amount of luminous energy incident on the region 203 can be determined directly using the photoresistor 202. A temperature measurement at the region 203 is not required. The amount of incident light is reflected by the electrical photoresistance value $R_{photo}$. The less light 108B is incident on the region 203, the greater the electrical photoresistance value $R_{photo}$. Accordingly, the photoresistor 202 heats the region 203. The greater the electrical photoresistance value $R_{photo}$, the greater the heating power by the photoresistor 202.

The photoresistor 202 heats the optical surface 201 locally dependent on the incident light 108B and thus compensates for deformations and/or refractive index changes that occur due to light absorption. This can prevent optical aberrations.

Figure 6A:
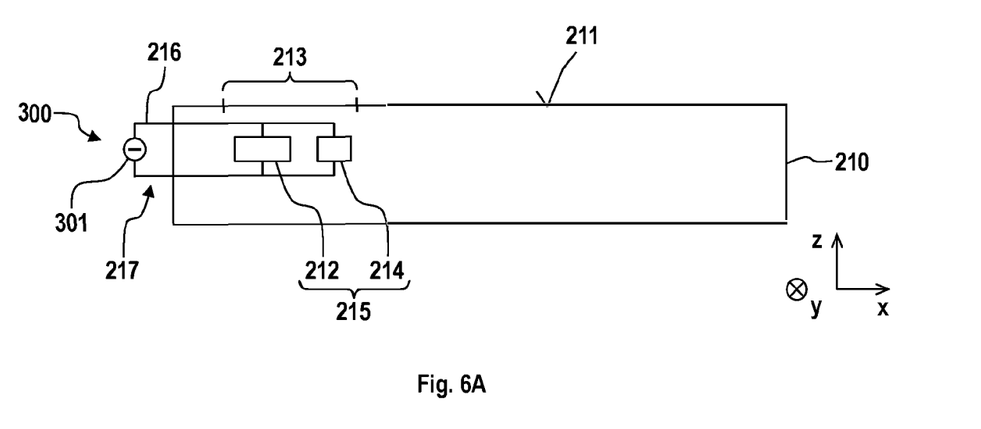
FIG. 6A shows a sectional view of an optical system according to a first embodiment comprising an optical element according to a second embodiment.

FIG. 6A shows a sectional view of an optical system 300 according to a first embodiment comprising an optical element 210 according to a second embodiment. The optical element 210 is largely similar to the optical element 200 of the first embodiment and likewise comprises an optical surface 211, a photoresistor 212, and a region 213.

As shown in FIG. 6A, in addition to the photoresistor 212, the optical element 210 also comprises a heating element 214, which is embodied as a heating wire. Together, the photoresistor 212 and the heating element 214 form a heating module 215 which belongs to the region 213. In addition to the lens element 210, the optical system 300 in FIG. 6A comprises a direct current source 301 arranged outside of the optical element 210 and connected to the heating module 215 via power supply lines 216. The use of a heating wire 214 in addition to the photoresistor 212 can be desirable because a higher heating capacity is thereby achieved. The heating wire 214 used can have a length of approximately 10 cm. In further embodiments, the length of the heating wire 214 can be different, especially in the case of larger or smaller optical elements 210.

Figure 6B:
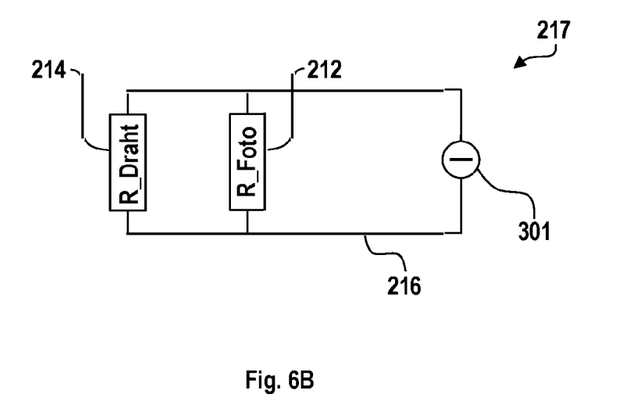
FIG. 6B shows an electrical circuit for the optical system in FIG. 6A.
Figure 7A:
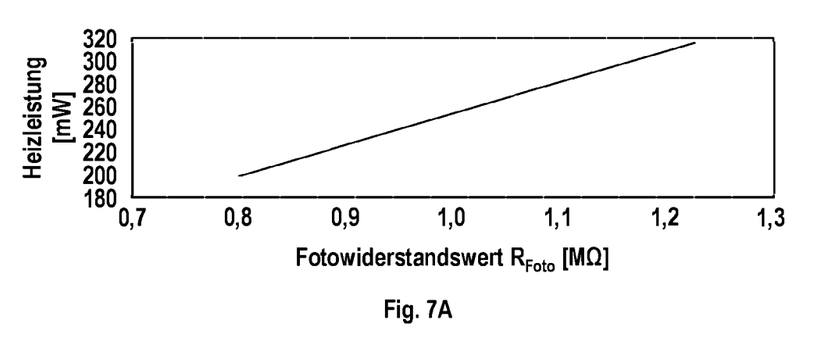
FIG. 7A shows a relationship between the electrical photoresistance value and the heating power of the heating element.
Figure 7B:
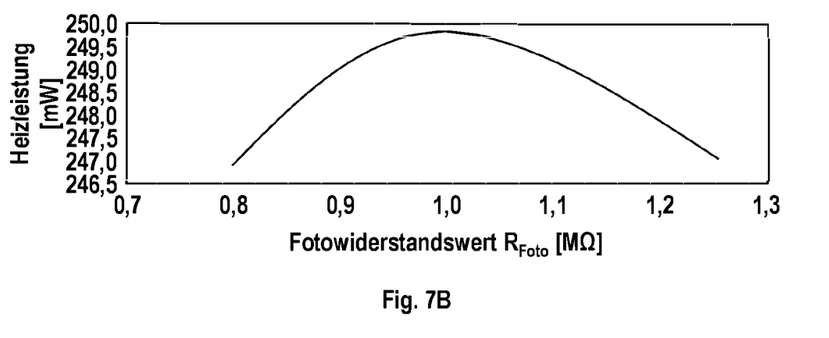
FIG. 7B shows a relationship between the electrical photoresistance value and the heating power of the photoresistor.
Figure 7C:
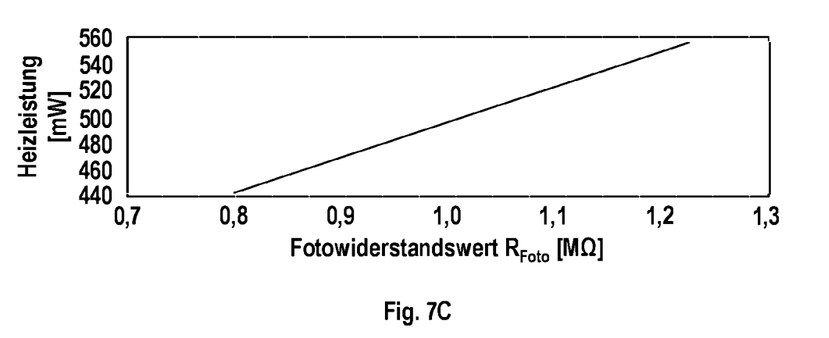
FIG. 7C shows a relationship between the electrical photoresistance value and the total heating power of the electrical circuit.

FIG. 6B shows a schematic representation of an electrical circuit 217 for the optical system 300 of FIG. 6A. The electrical circuit 217 comprises the direct current source 301, and also the photoresistor 212 and the heating wire 214 which are electrically connected in parallel. In the example shown, a dark resistance of the photoresistor 212 (after several seconds without light) is 1.25 MΩ, while a light resistance (at 1000 lx) is 0.83 MΩ. In the examples of FIGS. 7A-7C, a wire resistance value $R_{wire}$ roughly corresponds to the photoresistance value $R_{photo}$, that is to say $R_{photo} \approx R_{wire}$. $R_{photo}$ and $R_{wire}$ respectively are an average value of light and dark resistance, that is to say approximately 1 MΩ in the example given.

FIG. 7A shows a relationship between the electrical photoresistance value $R_{photo}$ and the heating power of the heating element 214. From FIG. 7A, it is evident that the heating power is linearly proportional to the photoresistance value $R_{photo}$. The greater the photoresistance value $R_{photo}$ (i.e., the less incident light), the greater the heating power from the heating wire 214.

FIG. 7B shows a relationship between the electrical photoresistance value $R_{photo}$ and the heating power of the photoresistor 212. As evident from FIG. 7B, the relationship is almost quadratic. Moreover, the heating power of the photoresistor 212 is almost constant.

FIG. 7C shows a relationship between the electrical photoresistance value $R_{photo}$ and the total heating power of the electrical circuit 217. The total heating power is linear in the case of the same current intensity and equal magnitude of resistances ($R_{photo} \approx R_{wire}$). This means that the photoresistor 214 can be used as a control element for the total heating power of the electrical circuit 217.

The total heating power of the electrical circuit 217 with the heating module 215 is therefore dependent on the electrical photoresistance value $R_{photo}$. Therefore, the heating module 215 can be used to efficiently heat the region 203 when desired and to compensate deformations and/or changes in the refractive index of the lens element 210 that occur due to light absorption. The imaging quality can be increased as a result.

Instead of using a single heating module 215, as shown in FIG. 6A, a plurality of heating modules 215, each with one photoresistor 212 and one heating element 214, can also be used within the optical element 210. As a result, different regions 213 of the optical surface 211 can be monitored and heated.

Figure 8:
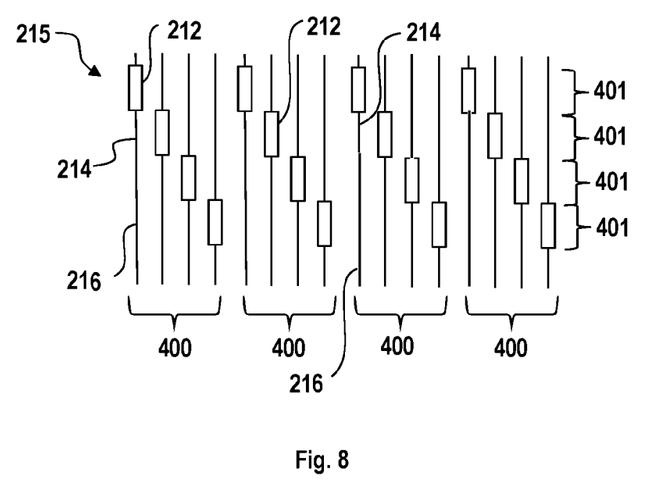
FIG. 8 shows a first example of an arrangement of a multiplicity of heating modules.
Figure 9:
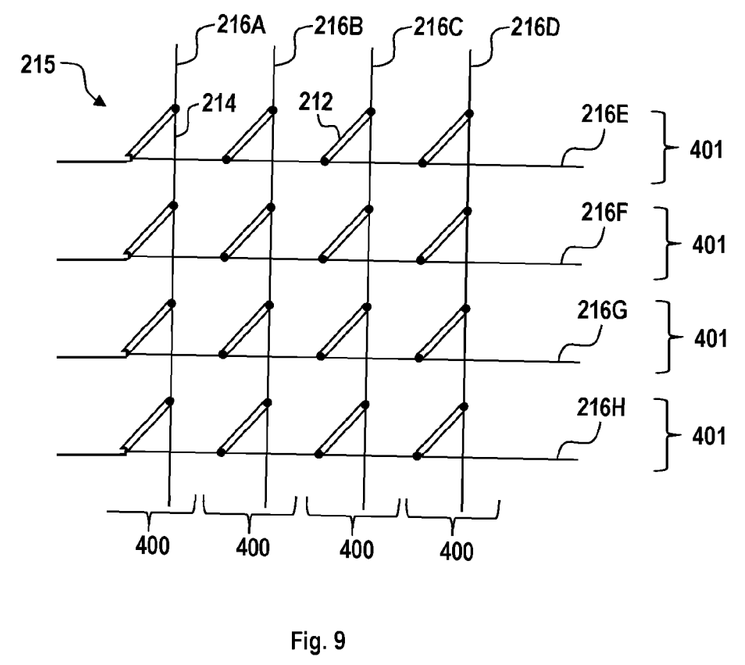
FIG. 9 shows a second example of an arrangement of a multiplicity of heating modules.

FIGS. 8 and 9 show examples of the arrangement of a multiplicity of heating modules 215. In the example of FIG. 8, sixteen heating modules 215 are arranged parallel to one another in four columns 400 and four rows 401. Each heating module 215 has an associated power supply line 216 that runs within the substrate 207 and supplies current to the heating module 215 from a source 301. The heating modules 215 in a column 400 are arranged slightly offset from one another in different rows 401 in order to allow the lines 216 to be laid.

The leads 216 run parallel to one another. With a grid of N×N heating modules 215, $N^2$ power supply lines 216 are used (N=4 in FIG. 8). In the example of FIG. 8, only one line 216 and one heating module 215 are provided with a reference sign, but the remaining lines 216 and heating modules 215 are identical. In the example in FIG. 8, the heating modules 215 can be supplied with current using lines integrated in the optics part.

FIG. 9 shows a second example of an arrangement of a multiplicity of heating modules 215. The heating modules 215 are arranged in a matrix arrangement at regular distances from one another. Here, too, a total of sixteen heating modules 215 are arranged in four columns 400 and four rows 401. Significantly fewer power supply lines 216A-216H are used in the arrangement of FIG. 9. With a grid of N×N heating modules 215, 2N power supply lines 216A-216H are used (N=4 in FIG. 9). In the example of FIG. 9, the power supply is implemented in accordance with a multiplex method. In this case, the column lines 216A-216D are sequentially applied to the rows 216E-216H and supplied with current. To this end, a control unit (not shown in FIGS. 8 and 9) can be used, the control unit being connected to direct current sources (not shown) and controlling the latter such that these supply the heating modules 215 with current. The control of the direct current sources by the control unit can be dependent on the photoresistance value in order to counteract a deformation of the optical surface and/or a change in the refractive index on account of the incident light.

Figure 10:
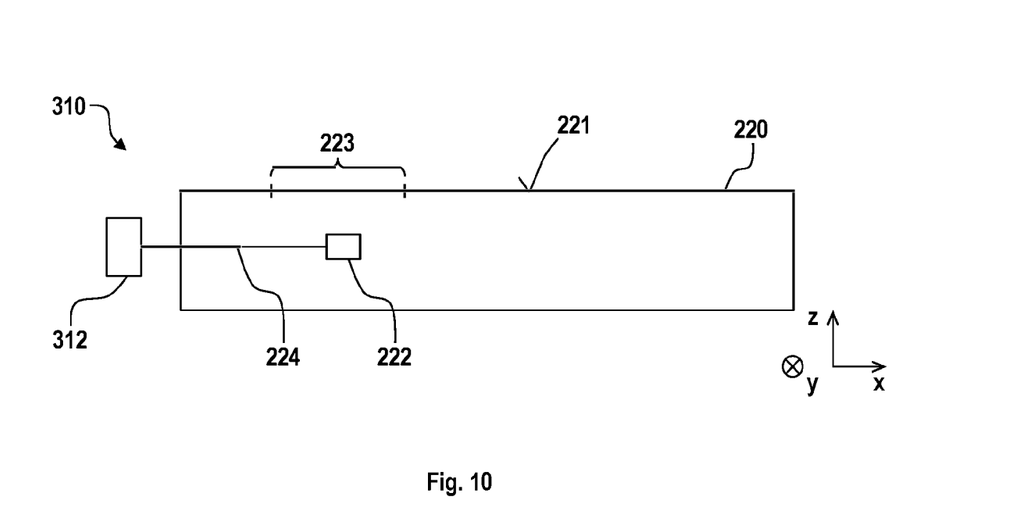
FIG. 10 shows a sectional view of an optical system according to a second embodiment comprising an optical element according to a third embodiment.

FIG. 10 shows a sectional view of an optical system 310 according to a second embodiment comprising an optical element 220 according to a third embodiment.

However, the optical system 310 differs from the optical system 300 of the first embodiment in that the optical system 310 comprises a control unit 312. The latter is connected to the photoresistor 222 via the line 224. The control unit 312 receives the sensed photoresistance value $R_{photo}$ from the photoresistor 222 via the line 224. Together with the photoresistor 222, the control unit 312 forms a light measurement sensor with which the light incident in the region 223 can be sensed. In principle, such a light measurement sensor can be used both in an EUV lithography apparatus 100A and in a DUV lithography apparatus 100B.

Figure 11:
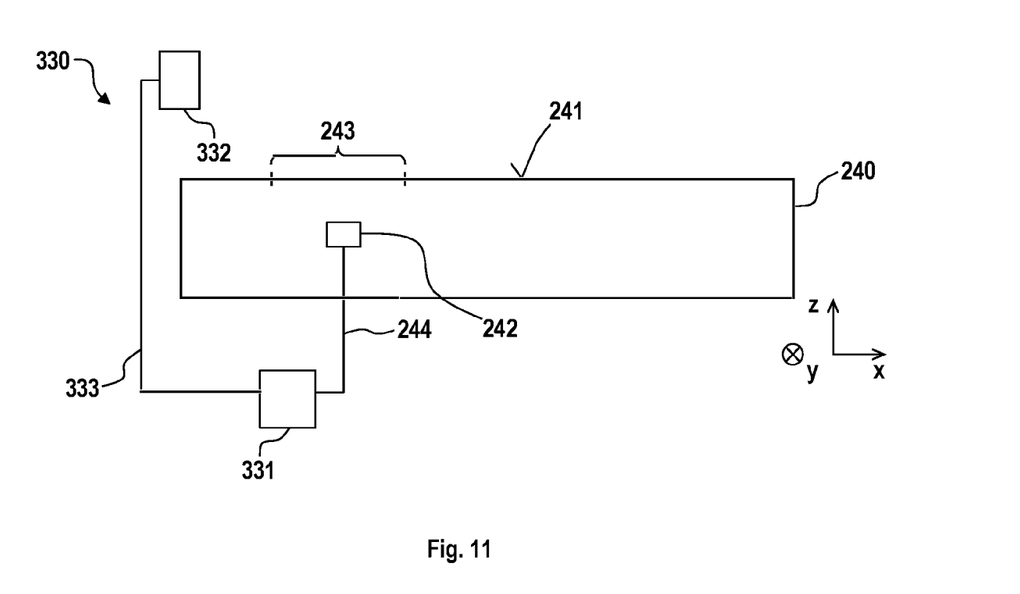
FIG. 11 shows a sectional view of an optical system according to a third embodiment comprising an optical element according to a fourth embodiment.

FIG. 11 shows a sectional view of an optical system 330 according to a third embodiment comprising an optical element 240 according to a fourth embodiment. In this case, the optical system 330 is a mirror for an EUV lithography apparatus 100A.

In addition to the optical element 240, the optical system 330 comprises a control unit 331 and an IR heater 332 which forms a heating element. The control unit 331 receives the photoresistance value $R_{photo}$ from the photoresistor 242 via a line 244. On the basis of the sensed photoresistance value $R_{photo}$, the control unit 332 generates a control signal which is then transmitted to the IR heater 332 via a line 333. The IR heater 332 heats the mirror 240 and for example the region 243 in accordance with the control signal.

Figure 12:
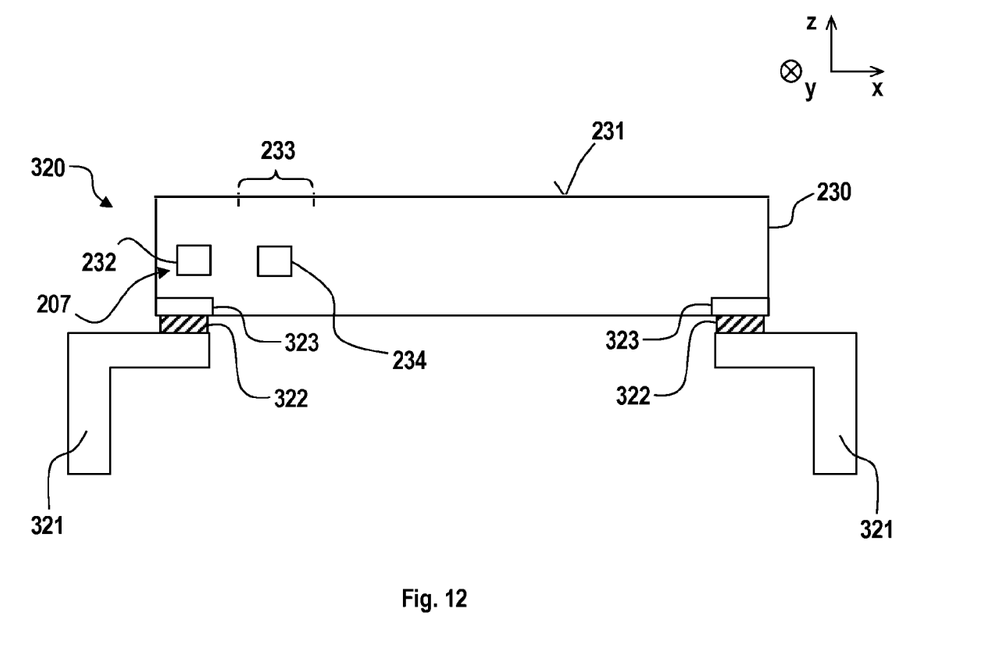
FIG. 12 shows a sectional view of an optical system according to a fourth embodiment comprising an optical element according to a fifth embodiment.

FIG. 12 shows a sectional view of an optical system 320 according to a fourth embodiment comprising an optical element 230 according to a fifth embodiment.

The lens element 230 is fixed to a mount (frame) 321 using adhesive 322. Since the adhesive 322 may be damaged by irradiation, it is protected by an adhesive protector 323 from the incoming radiation. However, the adhesive protector 323 absorbs light significantly, as a result of which the optical element is severely deformed and/or the refractive index is changed in the region of the adhesive protector 323. The incoming radiation incident on the adhesive protector 323 is sensed by the photoresistor 232, which is arranged in the substrate 207 above the adhesive protector 323. The associated heating element 234 is arranged slightly spaced apart from the photoresistor 232, specifically in such a way that the heating element 234 can heat a region 233 of the optical surface 231 adjacent to the adhesive protector 323.

The deformation and/or changes in the refractive index at the adhesive protector 323 are symmetrized (and thus become better correctable) using the optical system 320 by virtue of the heating element 234, dependent on the photoresistance value $R_{photo}$, heating the adjacent region 233 less when light is incident on the adhesive protector than in regions of the adhesive protector where less light or no light is incident.

Although the present disclosure has been described with reference to exemplary embodiments, it is modifiable in various ways. The embodiments described in the description of the figures can be combined as desired. For example, each of the optical elements 200, 210, 220, 230, 240 can comprise a plurality of photoresistors and/or heating elements, which can be arranged according to FIG. 8 or 9, for example.

LIST OF REFERENCE SIGNS

100A EUV lithography apparatus
100B DUV lithography apparatus
102 Beam shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Medium
200 Optical element
201 Optical surface
202 Photoresistor
203 Region of the optical surface
204 Metal contact
205 Semiconductor
206 Surface layer
207 Substrate
210 Optical element
211 Optical surface
212 Photoresistor
213 Region of the optical surface
214 Heating element
215 Heating module
216 Power supply line
216A-216H Power supply line
217 Electrical circuit
220 Optical element
221 Optical surface
222 Photoresistor
223 Region of the optical surface
224 Line
230 Optical element
231 Optical surface
232 Photoresistor
233 Neighboring region
234 Heating element
240 Optical element
241 Optical surface
242 Photoresistor
243 Region of the optical surface
244 Line
300 Optical element
301 Direct current source 310 Optical element
312 Control unit
320 Optical system
321 Mounting
322 Adhesive
323 Adhesive protector
330 Optical element
331 Control unit
332 IR heating element
333 Line
400 Column
401 Row
h Height
l Length
M1 Mirror
M2 Mirror
M3 Mirror
M4 Mirror
M5 Mirror
M6 Mirror
$R_{photo}$ Photoresistance value
$R_{wire}$ Wire resistance value

What is claimed is:

1. An optical element, comprising:
an optical surface having a region; and
a photoresistor configured to have an electrical photoresistance value that depends on an amount of luminous energy incident on the region of the optical surface, wherein:
the photoresistor is configured to heat the optical element by an amount that depends on the electrical photoresistance value of the photoresistor so that heating the optical element compensates a deformation of the optical element that occurs due to the incident light; and/or
the photoresistor is configured to heat the optical element by an amount that depends on the electrical photoresistance value of the photoresistor so that heating the optical element compensates a change in a refractive index of the optical element that occurs due to the incident light.

2. The optical element of claim 1, wherein the photoresistor is configured to heat the optical element by an amount that depends on the electrical photoresistance value of the photoresistor so that heating the optical element compensates a deformation of the optical element that occurs due to the incident light.

3. The optical element of claim 1, wherein the photoresistor is configured to heat the optical element by an amount that depends on the electrical photoresistance value of the photoresistor so that heating the optical element compensates a change in a refractive index of the optical element that occurs due to the incident light.

4. The optical element of claim 1, further comprising a heating element configured to heat the region of the optical surface by an amount that depends on the electrical photoresistance value of the photoresistor.

5. The optical element of claim 4, wherein the heating element is connected in parallel with the photoresistor.

6. The optical element of claim 4, wherein the heating element is electrically connected to the photoresistor in an electrical circuit so that a change in the electrical photoresistance value of the photoresistor changes a total resistance of the electrical circuit thereby changing the amount by which the heating element heats the region of the optical surface.

7. The optical element of claim 4, wherein the heating element is configured so that the amount by which the heating element heats the region of optical surface increases as the electrical photoresistance value of the photoresistor increases.

8. The optical element of claim 4, further comprising a substrate beneath the region of the optical surface, wherein at least one of the following holds:
the photoresistor is in the substrate; and
the heating element is in the substrate.

9. The optical element of claim 4, wherein:
the optical element comprises a plurality of photoresistors, a plurality of heating elements, a plurality of heating modules and a plurality of regions;
each heating module is defined by one photoresistor and one heating element;
each heating module is configured to heat a different region of the optical surface.

10. The optical element of claim 9, further comprising a plurality of power supply lines, wherein each heating module is configured to be supplied with current by a dedicated power supply line, and the power supply lines are within the substrate of the optical element.

11. The optical element of claim 10, wherein the power supply lines run parallel to one another.

12. The optical element of claim 9, further comprising a power supply line connected to a plurality of the heating modules so that power supply line is configured to power the heating modules.

13. The optical element of claim 9, further comprising a power supply line connected to a plurality of the heating modules so that the power supply line is configured to power to the heating module according in a multiplex fashion.

14. The optical element of claim 1, wherein the photoresistor comprises a semiconductor material.

15. The optical element of claim 1, wherein the photoresistor comprises at least one semiconductor material selected from the group consisting of amorphous silicon carbon nitride (SiCN) and a silicon carbon alloy (SiC:H).

16. A system, comprising:
an optical element;
a direct current source configured to supply current to the photoresistor; and
a control unit configured to control, depending on the electrical photoresistance value of the photoresistor, an amount by which the region of the optical element is heated,
wherein the optical element comprises:
an optical surface having a region; and
a photoresistor configured to have an electrical photoresistance value that depends on an amount of luminous energy incident on the region of the optical surface.

17. The system of claim 16, further comprising an external heating element configured to heat the region of the optical surface depending on the electrical photoresistance value of the photoresistor.

18. An apparatus, comprising:
the optical element of claim 1,
wherein the apparatus is a lithography apparatus.

19. The apparatus of claim 18, wherein the apparatus is selected from the group consisting of an EUV lithography apparatus and a DUV lithography apparatus.

20. A method of using a lithography apparatus comprising an optical element, the optical element comprising an optical surface and a photoresistor configured to have an electrical photoresistance value that depends on an amount of luminous energy incident on a region of the optical surface, the method comprising:
- determining the electrical photoresistance value of the photoresistor; and
- heating the region of the optical surface by an amount that depends on the electrical photoresistance value of the photoresistor.

* * * * *